United States Patent
Co et al.

(10) Patent No.: US 7,272,774 B2
(45) Date of Patent: Sep. 18, 2007

(54) EXTENDER CARD FOR TESTING ERROR-CORRECTION-CODE (ECC) STORAGE AREA ON MEMORY MODULES

(75) Inventors: Ramon S. Co, Trabuco Canyon, CA (US); Tat Leung Lai, Torrance, CA (US); David Sun, Irvine, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 742 days.

(21) Appl. No.: 10/709,156

(22) Filed: Apr. 16, 2004

(65) Prior Publication Data

US 2005/0246594 A1    Nov. 3, 2005

(51) Int. Cl.
*G11C 29/00* (2006.01)
*G06F 11/00* (2006.01)

(52) U.S. Cl. .......................... 714/764; 714/52
(58) Field of Classification Search ................ 714/764, 714/52

See application file for complete search history.

(56) References Cited

U.S. PATENT DOCUMENTS

| | | | |
|---|---|---|---|
| 4,190,311 A | 2/1980 | Basta .......................... 439/331 |
| 4,485,471 A | 11/1984 | Singh et al. ................. 714/702 |
| 4,735,580 A | 4/1988 | Hansen et al. .............. 439/264 |
| 4,888,773 A | 12/1989 | Arlington et al. ........... 714/764 |
| 4,979,914 A | 12/1990 | Robbins et al. ............. 439/681 |
| 5,267,242 A | 11/1993 | Lavallee et al. ............. 714/7 |
| 5,649,121 A * | 7/1997 | Budman et al. ............ 710/301 |
| 6,108,730 A | 8/2000 | Dell et al. ................... 710/301 |
| 6,210,178 B1 | 4/2001 | DeForest, Jr. .............. 439/76.1 |
| 6,219,807 B1 | 4/2001 | Ebihara et al. ............. 714/720 |
| 6,282,689 B1 | 8/2001 | Seyyedy ...................... 714/773 |
| 6,351,827 B1 | 2/2002 | Co et al. ....................... 714/42 |
| 6,789,148 B1 * | 9/2004 | Hinds .......................... 710/300 |

* cited by examiner

*Primary Examiner*—James C. Kerveros
(74) *Attorney, Agent, or Firm*—Stuart T. Auvinen; gPatent LLC (57) ABSTRACT

Memory modules with an extra dynamic-random-access memory (DRAM) chip for storing error-correction code (ECC) are tested on a personal computer (PC) motherboard tester using a cross-over extender card inserted into a memory module socket on the motherboard. ECC code generated on the motherboard is normally stored in the extra ECC DRAM chip, preventing test patterns such as checkerboards and walking-ones to be written directly to the ECC DRAM chip. During testing, the cross-over extender card routes signals from the motherboard for one of the data DRAM chips to the ECC DRAM chip, while the ECC code is routed to one of the data DRAM chips. The checkerboard or other test pattern is thus written and read from the ECC DRAM chip that normally stores the ECC code. The cross-over extender card can be hardwired, or can have a switch to allow normal operation or testing of the ECC DRAM chip.

20 Claims, 6 Drawing Sheets

FIG. 1A

PRIOR ART

PRIOR ART

|         | DATA DRAMS |         |         | ECC DRAM |
|---------|------------|---------|---------|----------|
| D1      | D2         | D3      | D4      | ECC      |
| 1 0 1 0 | 1 0 1 0    | 1 0 1 0 | 1 0 1 0 | 0 0 1 1  |
| 0 1 0 1 | 0 1 0 1    | 0 1 0 1 | 0 1 0 1 | 0 0 0 1  |
| 1 0 1 0 | 1 0 1 0    | 1 0 1 0 | 1 0 1 0 | 0 0 1 1  |
| 0 1 0 1 | 0 1 0 1    | 0 1 0 1 | 0 1 0 1 | 0 0 0 1  |

|         | DATA DRAMS |         |         | ECC DRAM |
|---------|------------|---------|---------|----------|
| D1      | D2         | D3      | D4      | ECC      |
| 1 0 1 0 | 1 0 1 0    | 1 0 1 0 | 0 0 1 1 | 1 0 1 0  |
| 0 1 0 1 | 0 1 0 1    | 0 1 0 1 | 0 0 0 1 | 0 1 0 1  |
| 1 0 1 0 | 1 0 1 0    | 1 0 1 0 | 0 0 1 1 | 1 0 1 0  |
| 0 1 0 1 | 0 1 0 1    | 0 1 0 1 | 0 0 0 1 | 0 1 0 1  |

EXTENDER CARD FOR TESTING ERROR-CORRECTION-CODE (ECC) STORAGE AREA ON MEMORY MODULES

BACKGROUND OF INVENTION

This invention relates to testing of memory modules, and more particularly to testing memory modules with error-correction code (ECC) memory.

Personal computers (PC's) and other electronic systems use small printed-circuit board (PCB) daughter cards known as memory modules. Memory modules are plugged into sockets on a motherboard, reducing a need to directly mount individual memory chips on the motherboard. The memory modules are built to meet specifications set by industry standards, thus ensuring a wide potential market and low cost.

Memory modules can be tested using general-purpose electronic-component testers, but these testers tend to be quite expensive. Memory modules can also be tested in PC-based testers. Since PC's are very inexpensive, test costs can be significantly reduced. The memory modules being tested can be inserted into memory module sockets on a PC motherboard, which executes a memory test program to test the memory modules. See as examples U.S. Pat. Nos. 6,178,526, 6,415,397, 6,357,023, and 6,351,827.

A drawback to using a PC motherboard for testing memory modules is that the memory module sockets can become worn with use, since thousands of different memory modules may be inserted and removed for testing. The standard memory module sockets on a PC motherboard are not designed for such frequent replacement of the memory modules. Specialized test sockets such as zero-insertion-force (ZIF) sockets may replace the standard memory module sockets on PC motherboards used as testers.

Another approach is to insert an extender card into the PC motherboard's memory module socket. The memory modules are then inserted into a test socket on the extender card for testing. A higher-quality test socket can be mounted on the extender card to receive the memory modules under test.

Figure 1A:
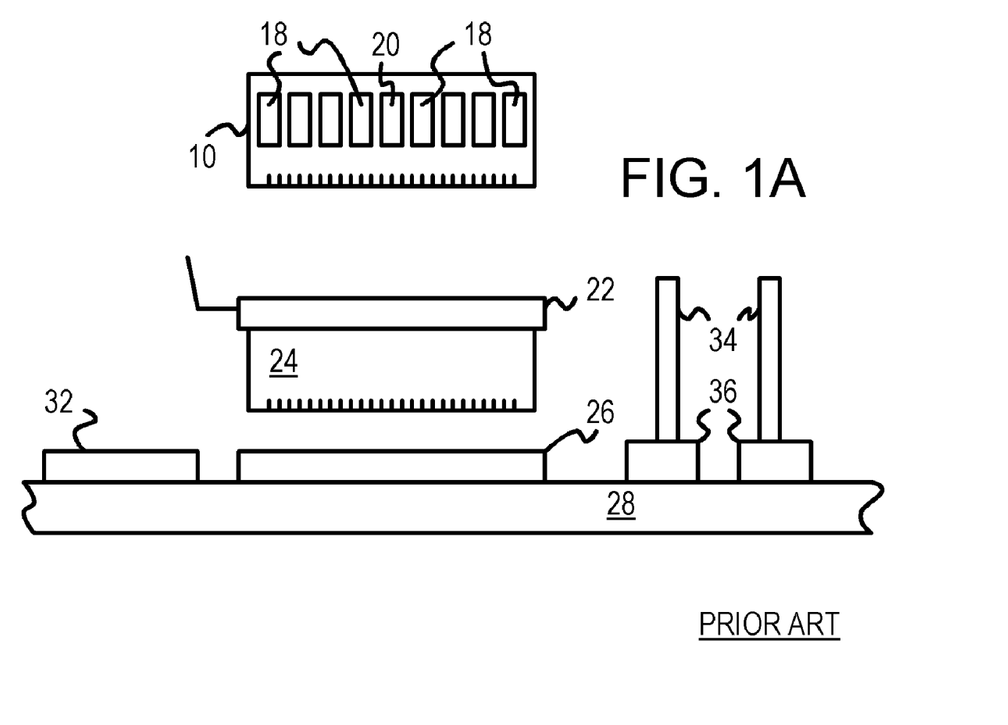
FIGS. 1A-B show an extender card between a PC motherboard and memory module being tested by the motherboard.
Figure 1B:
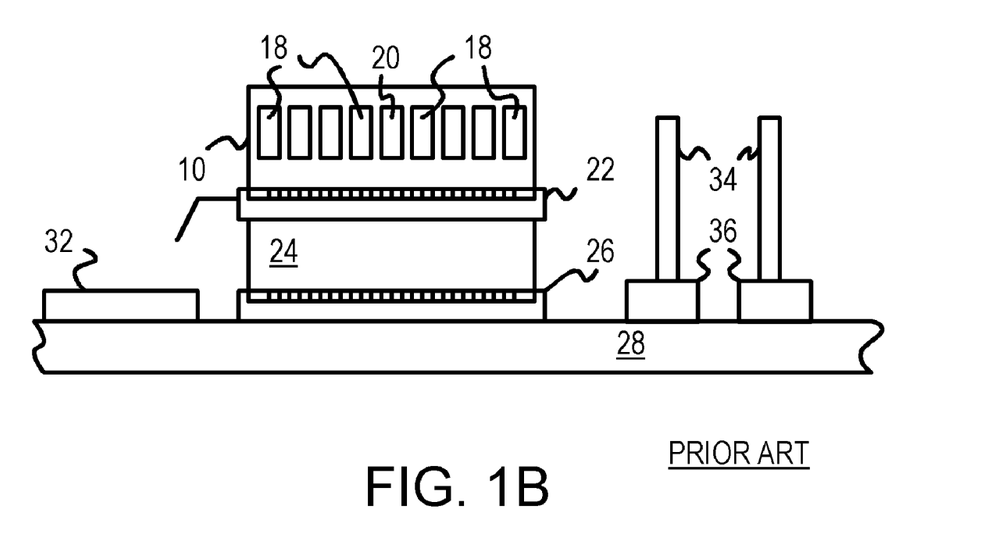

FIGS. 1A-B show an extender card between a PC motherboard and memory module being tested by the motherboard. In FIG. 1A, memory module 10 contains DRAM chips 18, 20. The number and arrangement of DRAM chips 18, 20 vary with the memory module design and size, and may be mounted on one or both sides of memory module 10.

Extender card 24 is a printed-circuit board (PCB) or other substrate that has test socket 22 mounted on its upper edge, and has metal fingers or contact pads along its bottom edge. Metal wiring traces on extender card 24 connect corresponding signals on the lower-edge contact pads to metal pads in test socket 22, thus passing signals through between PC motherboard 28 and memory module 10.

PC motherboard 28 is a larger PCB that has chips, sockets, and other components mounted thereon, such as chip 32 and expansion sockets 36 which have expansion cards 34 plugged in. Expansion cards 34 can be Peripheral Component Interconnect (PCI), AT-bus, or other expansion cards. Chip 32 can be the main microprocessor, chip set, cache memory, or other chips.

Memory module socket 26 is one of several sockets designed to fit memory module 10 or other memory modules. Memory module socket 26 is mounted to the PCB substrate of PC motherboard 28, and fits the contact pads on the bottom side of extender card 24, or the contact pads on memory module 10.

FIG. 1B shows the memory module and extender card plugged into the PC motherboard. The contact pads on memory module 10 fit into test socket 22 on extender card 24. Test socket 22 can be a zero-insertion force test socket while memory module socket 26 on PC motherboard 28 is an inexpensive socket. Test socket 22 can also be a conventional memory module socket similar to memory module socket 26. The contact pads on the bottom edge of extender card 24 fit into memory module socket 26 on PC motherboard 28. Electrical contact is made by sockets 22, 26, with wiring traces on extender card 24 passing most signals through from PC motherboard 28 to memory module 10.

During testing, different memory modules 10 are repeatedly inserted into test socket 22, tested by execution of a test program on PC motherboard 28, and removed from test socket 22 and placed in a passing or a failing bin. Extender card 24 remains inserted in test socket 22 while memory module 10 is repeatedly replaced.

Figure 2A:
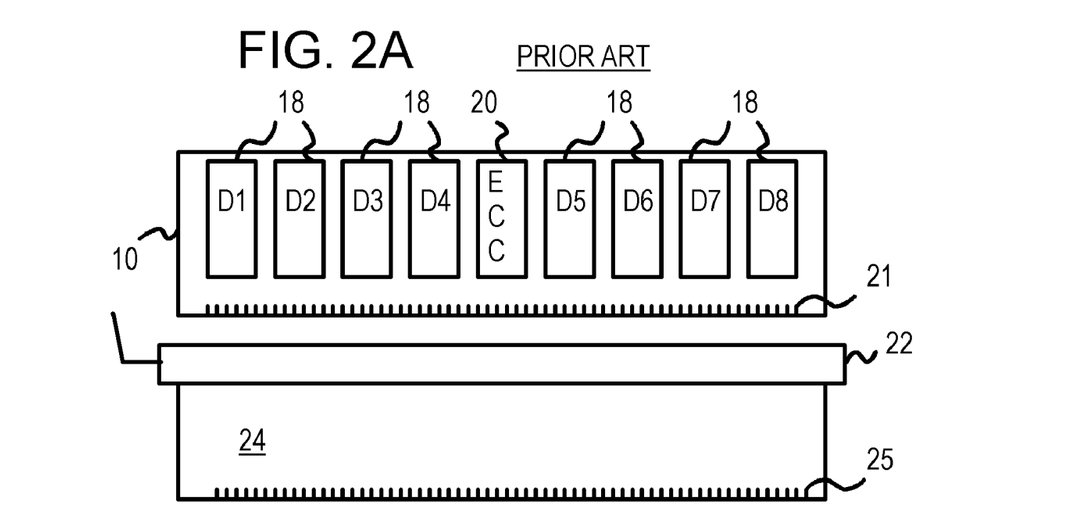
FIGS. 2A-B show testing a memory module with an error-correction code (ECC) memory using an extender card.
Figure 2B:
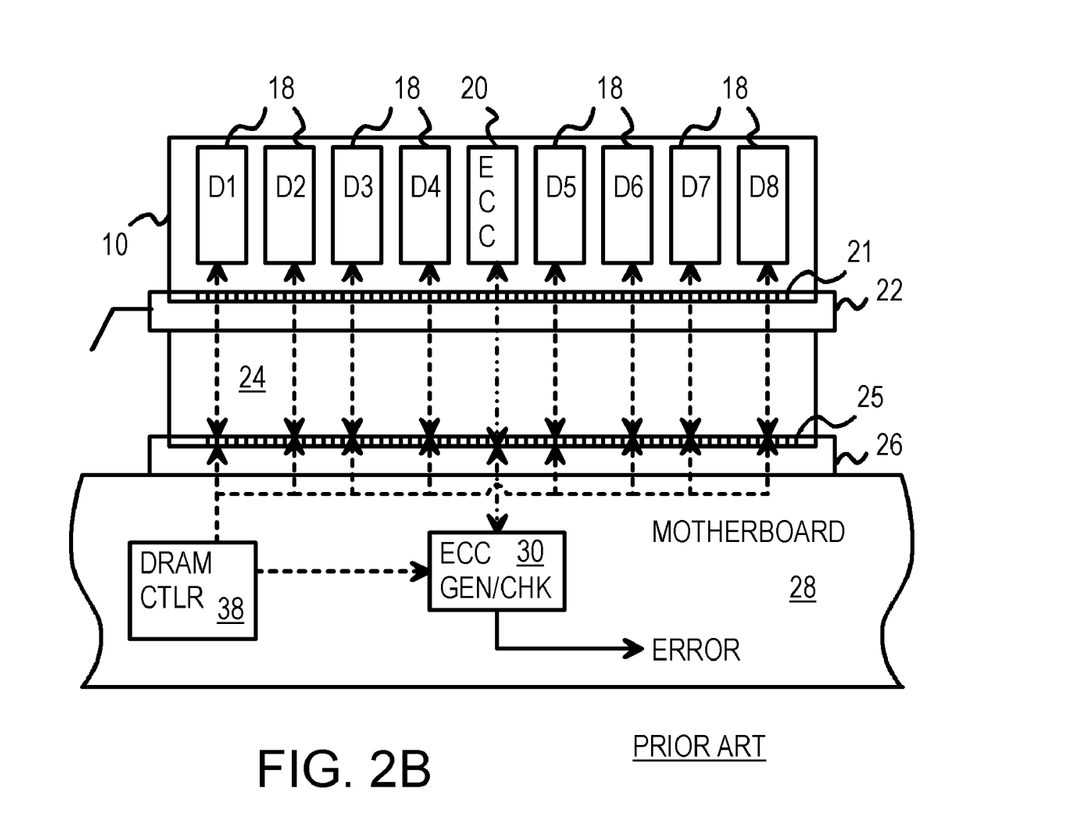

FIGS. 2A-B show testing a memory module with an error-correction code (ECC) memory using an extender card. Some memories contain redundant bits of storage for error detection and/or error correction. For example, an 8-bit-wide memory can have one extra bit, called a parity bit, for detecting an error in the 8-bit word. Memory modules can have 9 bits of data, including the parity bit and 8 data bits.

With a single parity bit, errors can only be detected, not corrected. Having additional redundant bits allows for detection and correction of simple errors. The additional bits may also allow for detection but not correction of more complex errors.

As an example, a dual-inline memory module (DIMM) may contain 64 data bits and 8 ECC bits. Memory module 10 uses a total of nine 8-bit-wide DRAM chips. Eight DRAM chips 18 store the 64 data bits while one ECC DRAM chip 20 stores the 8 ECC bits. ECC DRAM chip 20 may be located in the middle of the eight DRAM chips 18, or in some other arrangement, and some of the DRAM chips may be mounted on the back side of memory module 10, or a second bank of chips may be mounted on the back side of memory module 10.

Metal contact pads 21 on the lower edge of memory module 10 are for inserting into test socket 22 on extender card 24. Metal wiring traces on extender card 24 connect signals from test socket 22 to the corresponding signals on lower-edge contact pads 25 so that all signals are passed through unchanged, as shown in FIG. 2B.

The direct pass-through of signals from lower-edge contact pads 25 to test socket 22 and contact pads 21 allows memory module 10 to be tested just as if memory module 10 were inserted directly into memory module socket 26 on PC motherboard 28. The increased height of test socket 22 above the surface of PC motherboard 28 makes testing easier since test socket 22 is more easily reached by an operator or handler machine.

During testing of memory module 10 inserted into test socket 22, DRAM controller 38 on PC motherboard 28 receives data from a CPU or bus master and generates control signals to DRAM chips 18, 20 on memory module 10 to write the data as 64-bit words. The 64 data bits are written to DRAM chips 18 on memory module 10 by DRAM controller 38, and the 64 data bits are also sent from DRAM controller 38 to ECC generator 30 on PC motherboard 28.

ECC generator 30 generates the 8 ECC bits that are the proper correction code for the 64 data bits. The 8 ECC bits are sent to ECC DRAM chip 20 through extender card 24 to be stored with the 64 data bits at the same address in the memory module.

When the address location is read back, the 64 data bits from DRAM chips 18 are again input to ECC generator 30, and the generated ECC code is compared with the 8 ECC bits read from ECC DRAM chip 20 on memory module 10. When the generated and read-back codes mis-match, error correction is attempted, or an error is signaled. An error could occur if the DRAM chips were not refreshed quickly enough, or due to a soft error such as an alpha-particle hitting a DRAM chip.

During testing of memory module 10, a variety of specialized data patterns may be written to DRAM chips 18 and read back. These specialized data patterns have been developed to detect certain types of errors that can occur in DRAM chips, such as a single memory cell that is stuck high or low, or shorts between adjacent cells. Patterns such as walking-ones, walking-zeros, checkerboard, and inverse checkerboards are often used.

Figure 3:
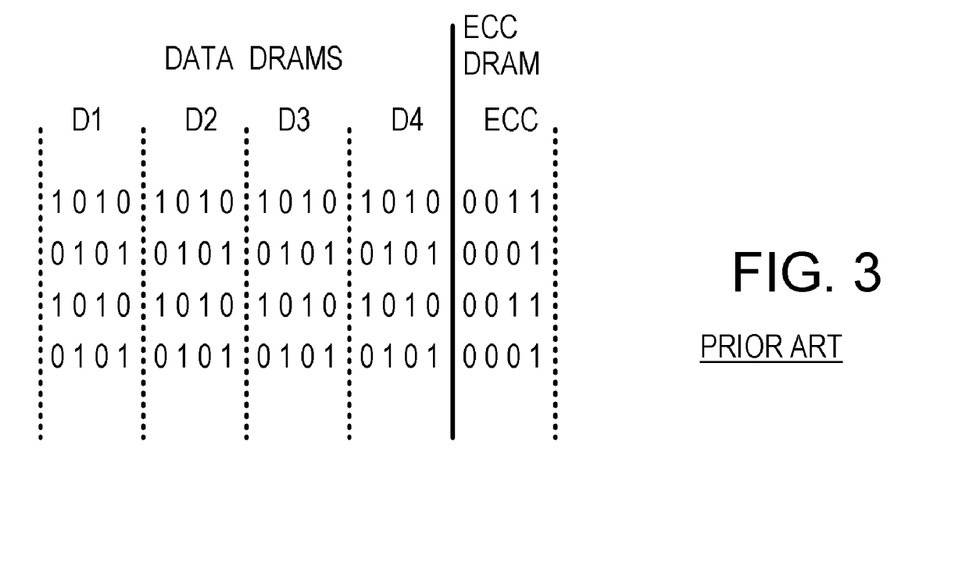
FIG. 3 shows a checkerboard pattern stored in DRAM chips on a memory module.

FIG. 3 shows a checkerboard pattern stored in DRAM chips on a memory module. In this simplified example, only four data DRAM chips D1, D2, D3, D4 are shown and one ECC DRAM chip "ECC" in the five columns of the Figure. Each DRAM chip is only 4 bits wide in this simplified example.

A checkerboard pattern is written to each odd address, while an inverse-checkerboard pattern is written to each even address by a test program executing on the PC motherboard. This checkerboard pattern is useful for detecting a single memory cell that is shorted to a neighboring cell, since the neighboring cells all have the opposite data state. A cell in the "1" state is surrounded by 4 cells in the "0" state.

While the checkerboard pattern is properly written to the data DRAM chips 18, the ECC DRAM chip does not necessarily contain a checkerboard pattern. This is because the ECC DRAM chip is not written by the test program. Instead, ECC DRAM chip 20 is written by ECC code generated by ECC generator 30 on PC motherboard 28. The value of the ECC code is determined by the ECC coding function, which is a function of the data bits written to data DRAM chips 18. While a variety of ECC coding functions could be used, in general the ECC code does not look like the data pattern.

For example, the checkerboard pattern could produce the ECC value 0011 while the inverse checkerboard pattern produces an ECC value of 0001. Since the pattern of bits in ECC DRAM chip 20 is not a checkerboard, errors may be undetected in ECC DRAM chip 20.

A single memory cell in ECC DRAM chip 20 that is shorted to a neighboring cell may go undetected, since the neighboring cells do not all have the opposite data state. A cell in the "0" state might be surrounded by 1, 3, or 4 cells in the "0" state that could hide the error due to a short.

While memory modules with redundant storage are useful for error detection and correction, testing of such ECC memory modules can be problematic. A better testing procedure for use with ECC memory modules is desired. An extender card for testing ECC memory modules is also desired.

DETAILED DESCRIPTION

The present invention relates to an improvement in testing of memory modules. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that an extender card may be modified to improve testing of memory modules with redundant memory chips for storage of error-correction code (ECC). The modified extender card has cross-over connections to route data from the ECC generator on the PC motherboard to one of the data DRAMs, allowing data from the DRAM controller to reach the ECC DRAM. Walking-ones and zeros, checkerboard patterns, and various marching patterns can then be written into the ECC DRAM for full pattern-sensitivity testing. The ECC DRAM can be fully exercised with all the desired test patterns using the cross-over extender card.

The memory module may be tested twice—once with a standard extender card to fully test the data DRAM, and a second time with the cross-over extender card to test the ECC DRAM with the test patterns. Alternately, the cross-over connections on the cross-over extender card can be implemented with a multiplexer or switch that is controlled by the test program.

Figure 4:
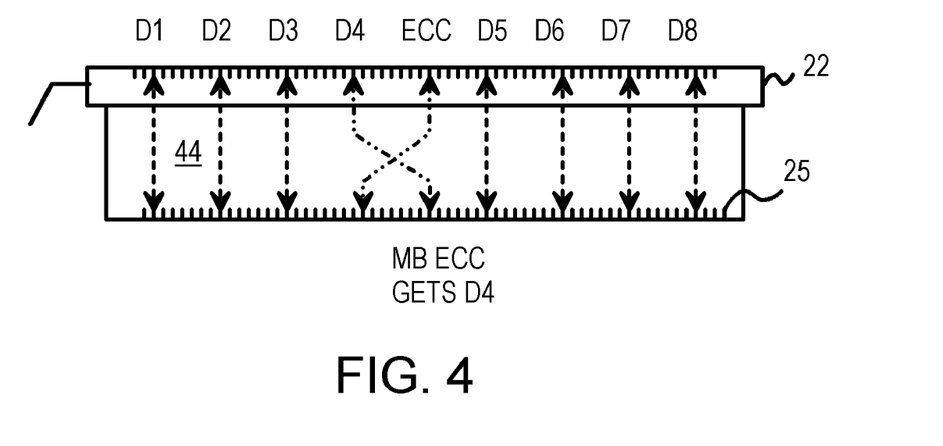
FIG. 4 shows a cross-over extender card for testing ECC memory modules.

FIG. 4 shows a cross-over extender card for testing ECC memory modules. Cross-over extender card 44 has a PCB substrate with test socket 22 mounted to it. Wiring traces on cross-over extender card 44 connect signals from test socket 22 to the corresponding signals in lower-edge contact pads 25, except that signals from the ECC DRAM on the memory module inserted into test socket 22 are swapped with the signals from one of the data DRAMs on the memory module. For example, data signals for data DRAM chip D4 are swapped with the corresponding data signals for the ECC DRAM chip by cross-over extender card 44.

Figure 5:
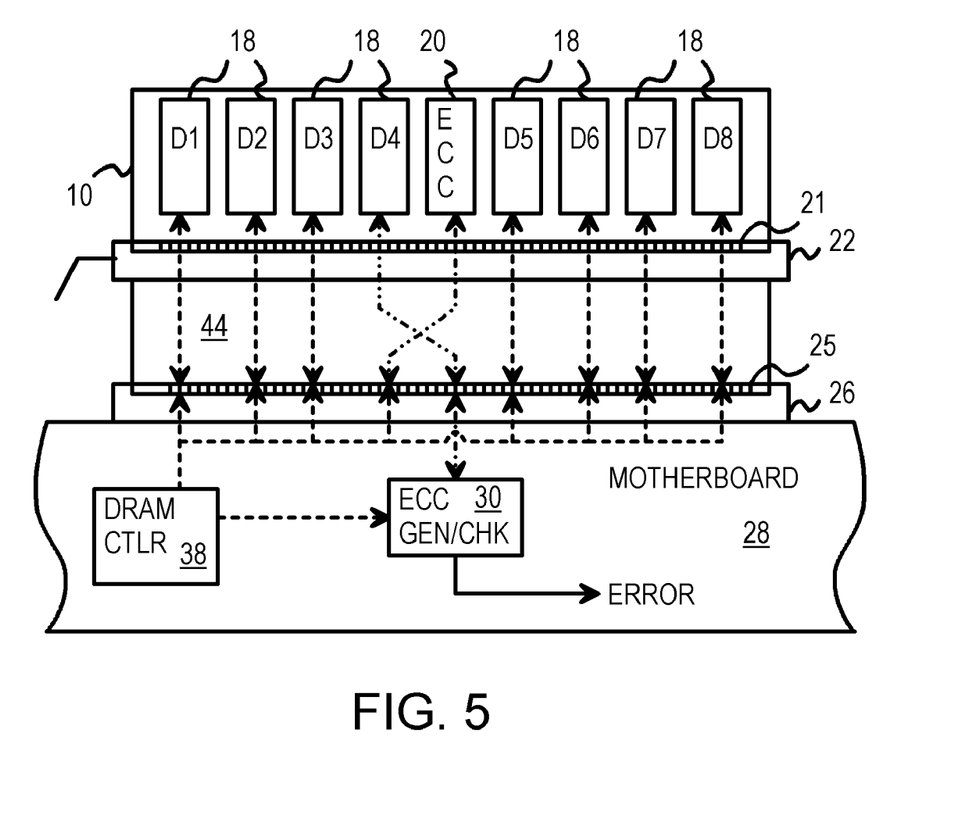
FIG. 5 shows a cross-over extender card inserted into a PC motherboard tester that is testing an ECC memory module.

FIG. 5 shows a cross-over extender card inserted into a PC motherboard tester that is testing an ECC memory module. Memory module 10 can be a dual-inline memory module (DIMM) with 64 data bits and 8 ECC bits, or can have other arrangements. In the example shown, memory module 10 uses a total of nine 8-bit-wide DRAM chips, labeled D1 to D8 and ECC. Eight DRAM chips 18 store the 64 data bits while one ECC DRAM chip 20 stores the 8 ECC bits.

Metal contact pads 21 on the lower edge of memory module 10 are for inserting into test socket 22 on cross-over extender card 44. Metal wiring traces on cross-over extender card 44 connect signals from test socket 22 to the corresponding signals on lower-edge contact pads 25 for seven DRAM chips D1, D2, D3, D5, D6, D7, and D8. However, data signals for DRAM chip D4 are crossed over with data signals from ECC DRAM chip 20 by the wiring traces on cross-over extender card 44.

The pass-through and crossing-over of signals from lower-edge contact pads 25 to test socket 22 and contact pads 21 allows memory module 10 to be tested just as if memory module 10 were inserted directly into memory module socket 26 on PC motherboard 28, except that the ECC code is stored in data DRAM chip D4, while the data normally stored in DRAM chip D4 is instead stored in ECC DRAM chip 20.

During testing of memory module 10 inserted into test socket 22, DRAM controller 38 on PC motherboard 28 receives data from a CPU or bus master and generates control signals to DRAM chips 18, 20 on memory module 10 to write the data as 64-bit words. The 64 data bits are written to seven DRAM chips D1, D2, D3, D5, D6, D7, and D8 and to ECC DRAM chip 20 on memory module 10 by DRAM controller 38. However, DRAM controller 38 does not write data to data DRAM chip D4.

The 64 data bits are also sent from DRAM controller 38 to ECC generator 30 on PC motherboard 28. ECC generator 30 generates the 8 ECC bits that are the proper correction code for the 64 data bits. The 8 ECC bits are sent on the ECC DRAM data lines of memory module socket 26 and lower-edge contact pads 25, and are crossed-over to the data lines for data DRAM D4 by extender card 44. The ECC code from ECC generator 30 is then sent over test socket 22 and contact pads 21 to data DRAM D4 on memory module 10.

When the address location is read back, the 64 data bits from seven DRAM chips 18 and from ECC DRAM chip 20 are again input to ECC generator 30, and the generated ECC code is compared with the 8 ECC bits read from data DRAM D4 on memory module 10. When the generated and read-back codes mis-match, error correction is attempted, or an error is signaled. An error could occur if the DRAM chips were not refreshed quickly enough, or due to a soft error such as an alpha-particle hitting a DRAM chip.

ECC DRAM chip 20 may be located in the middle of the eight DRAM chips 18, or in some other arrangement, and some of the DRAM chips may be mounted on the back side of memory module 10, or a second bank of chips may be mounted on the back side of memory module 10. The increased height of test socket 22 above the surface of PC motherboard 28 that cross-over extender card 44 produces makes testing easier since test socket 22 is more easily reached by an operator or handler machine.

During testing of memory module 10, a variety of specialized data patterns may be written to DRAM chips 18 and ECC DRAM chip 20 and read back. These specialized data patterns are for detecting certain types of errors that can occur in DRAM chips, such as a single memory cell that is stuck high or low, or shorts between adjacent cells. Patterns such as walking-ones, walking-zeros, checkerboard, and inverse checkerboards are often used.

Figure 6:
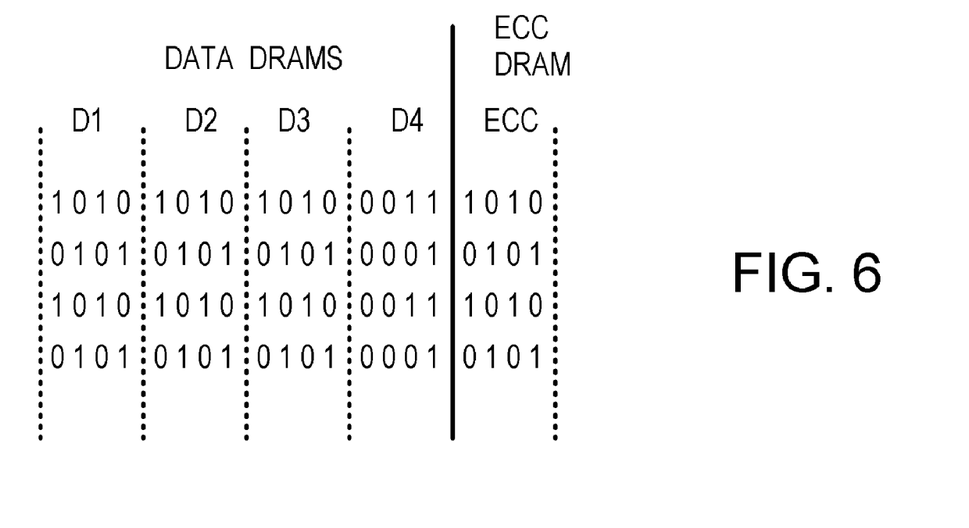
FIG. 6 shows a checkerboard pattern stored in DRAM chips and on the ECC DRAM chip on a memory module.

FIG. 6 shows a checkerboard pattern stored in DRAM chips and on the ECC DRAM chip on a memory module. In this simplified example, only four data DRAM chips D1, D2, D3, D4 are shown and one ECC DRAM chip "ECC" in the five columns of the Figure. Each DRAM chip is only 4 bits wide in this simplified example.

A checkerboard pattern is written to each odd address, while an inverse-checkerboard pattern is written to each even address by a test program executing on the PC motherboard. This checkerboard pattern is useful for detecting a single memory cell that is shorted to a neighboring cell, since the neighboring cells all have the opposite data state. A cell in the "1" state is surrounded by 4 cells in the "0" state.

The checkerboard pattern is written by the DRAM controller to data DRAM chips D1, D2, and D3 but not to D4. Instead, the checkerboard pattern normally written to DRAM chip D4 is crossed-over by the cross-over extender card to be stored in the ECC DRAM chip. Thus the checkerboard pattern is written into the ECC DRAM chip. The ECC code normally written to the ECC DRAM chip is instead written to data DRAM chip D4.

DRAM chip D4 is not written by the test program. Instead, DRAM chip D4 is written by the ECC code generated by ECC generator 30 on PC motherboard 28. The value of the ECC code is determined by the ECC coding function, which is a function of the data bits written to data DRAM chips 18 and in ECC DRAM chip 20. While a variety of ECC coding functions could be used, in general the ECC code does not look like the data pattern.

Since the ECC DRAM chip is written with the checkerboard pattern, the ECC DRAM chip can be fully tested for pattern-sensitive errors, such as single-bit errors and adjacent shorts. A single memory cell in the ECC DRAM that is shorted to a neighboring cell can be detected, since the neighboring cells all have the opposite data state. A cell in the "1" state is surrounded by 4 cells in the "0" state in ECC DRAM chip 20.

Of course, now data DRAM chip D4 is not being fully tested, since it is not written with the checkerboard pattern, but is instead written with the ECC code. To fully test both the ECC DRAM chip and the D4 data DRAM chip, the memory module may be tested twice: once with the standard pass-through extender card 24 to test DRAM chips D1 to D8, including chip D4, and a second time with cross-over extender card 44 to test the ECC DRAM chip. The second pass using cross-over extender card 44 might not have to be as extensive since there are fewer ECC bits per address than data bits. For example, a shorter walking-ones pattern could be used for testing the ECC DRAM.

Figure 7:
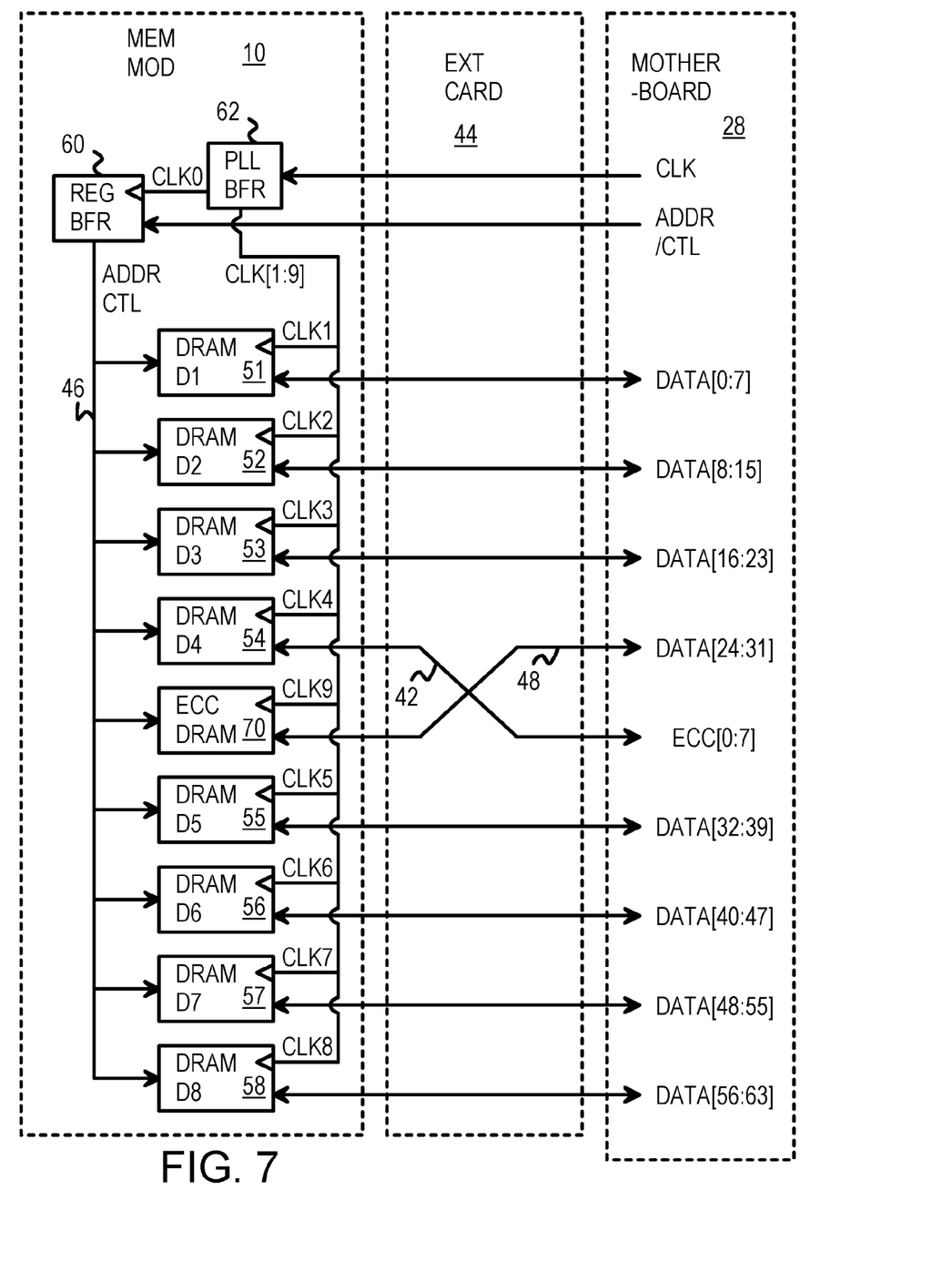
FIG. 7 is a wiring diagram showing connection of signals through the cross-over extender card to the ECC memory module under test.

FIG. 7 is a wiring diagram showing connection of signals through the cross-over extender card to the ECC memory module under test. Power and ground lines (not shown) from PC motherboard 28 are routed through contacts on socket 26 and wiring traces on cross-over extender card 44 to contacts on test socket 22 to power DRAM chips 18 and ECC DRAM chip 20 and other components on memory module 10, such as Phase-locked loop (PLL) buffer 62 and register 60. PLL buffer 62 receives a clock signal from PC motherboard 28 and generates CLK0 to register 60, and clock signals CLK1 to CLK8 which clock data DRAM chips 51 to 58 (D1 to D8), and clock CLK9 which clocks ECC DRAM chip 70. The many clock signals can be generated with very little skew using PLL feedback techniques when the input clock is stable.

Address and control signals from the DRAM controller on PC motherboard 28 are passed through cross-over extender card 44 and sockets 22, 26 to reach register 60 on memory module 10. Register 60 buffers and synchronizes the address and control signals before they are applied on address bus 46 to DRAM chips 51-58 and to ECC DRAM chip 70.

Each of DRAM chips 51-58 and ECC DRAM chip 70 has an 8-bit data bus, and can store data as 8-bit words, for a total of 64 data bits and 8 ECC bits per address sent over address bus 46. Data bits [0:7] from the DRAM controller or a data buffer on PC motherboard 28 are routed to the 8 data inputs of D1 DRAM chip 51, while data bits [8:15] from the DRAM controller or a data buffer on PC motherboard 28 are routed to the 8 data inputs of D2 DRAM chip 52. Data bits [16:23] from the DRAM controller are routed to the 8 data inputs of D3 DRAM chip 53.

Similarly, data bits [32:39] from PC motherboard 28 are routed to the 8 data inputs of D5 DRAM chip 55, data bits [40:47] from PC motherboard 28 are routed to the 8 data inputs of D6 DRAM chip 56, data bits [48:55] from PC motherboard 28 are routed to the 8 data inputs of D7 DRAM chip 57, and data bits [55:63] from PC motherboard 28 are routed to the 8 data inputs of D8 DRAM chip 58. These are the direct pass-through data bits, data bits [0:23] and data bits [32:63].

Data bits [24:31] are not passed directly through. Instead, cross-over extender card 44 crosses over these bits, swapping them with the 8 ECC bits ECC[0:7]. Data bits [24:31] from PC motherboard 28 are routed over crossover bus 48 on cross-over extender card 44 to the 8 data inputs of ECC DRAM chip 70. ECC bits ECC[0:7] from ECC generator 30 on PC motherboard 28 are routed over cross-over bus 42 on cross-over extender card 44 to the 8 data inputs of D4 data DRAM chip 54.

Thus the ECC code bits ECC[0:7] from ECC generator 30 on PC motherboard 28 are routed over cross-over bus 42 to be stored in D4 data DRAM chip 54. Data bits [24:31] from PC motherboard 28 are routed over cross-over bus 48 to be stored in ECC DRAM chip 70. The test pattern is stored in ECC DRAM chip 70, while the ECC code is stored in D4 data DRAM chip 54.

Figure 8:
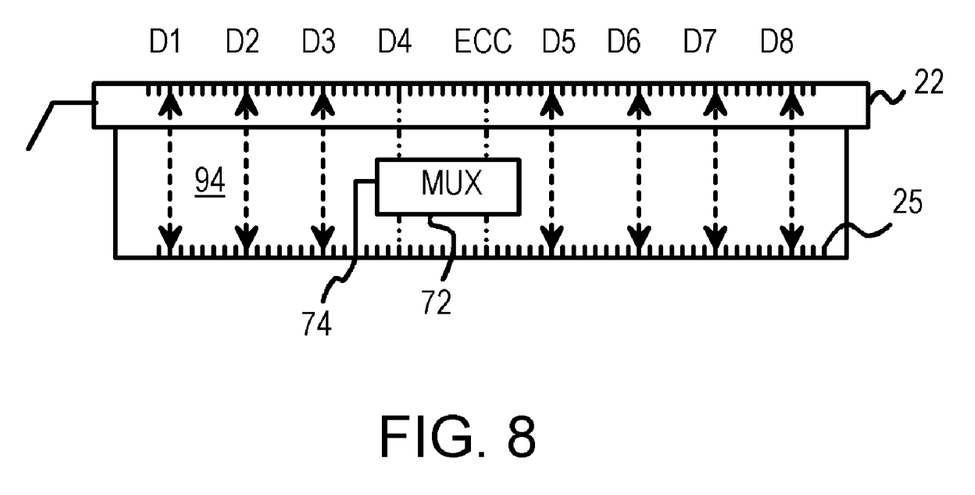
FIG. 8 is an alternate embodiment of the cross-over extender card with a controllable mux for cross-over.

FIG. 8 is an alternate embodiment of the cross-over extender card with a controllable mux for cross-over. Cross-over extender card 94 is mounted with mux switch 72. Mux switch 72 receives the 8 data bits D[24:31] and the 8 ECC bits ECC[0:7] from PC motherboard 28 through lower-edge contact pads 25. Mux switch 72 also connects to the 8 data signals for data DRAM chip D4 on memory module 10 and to the 8 data signals to the ECC DRAM chip on the memory module inserted into test socket 22.

Mux switch 72 responds to mux control signal 74, which can be generated by logic on PC motherboard 28 and applied to an otherwise unused pin on memory module socket 26 and lower-edge contact pads 25. For example, an unused pin in the interface, or an upper address bit can be used for mux control signal 74.

When mux control signal 74 is in a first state, such as 0, Mux switch 72 passes signals directly through. Data bits D[24:31] from PC motherboard 28 are passed through mux switch 72 to the 8 data signals for data DRAM chip D4, while the 8 ECC bits ECC[0:7] are passed through to the 8 data signals to the ECC DRAM chip on the memory module. The memory module operates in a normal fashion, with the ECC code being stored in the ECC DRAM chip. The data DRAM can be written with test patterns, but the ECC DRAM chip cannot.

When mux control signal 74 is in a second state, such as 1, Mux switch 72 crosses-over signals. Data bits D[24:31] from PC motherboard 28 are crossed over through mux switch 72 to the 8 data signals of the ECC DRAM chip. The 8 ECC bits ECC[0:7] from PC motherboard 28 are also crossed over through mux switch 72 to the 8 data signals for data DRAM chip D4. The memory module operates in a test mode, with the ECC code being stored in the D4 DRAM chip. The ECC DRAM can be written with test patterns, but the D4 DRAM chip cannot.

A test program executing on PC motherboard 28 could first write and read test patterns to test the memory module inserted into test socket 22 of cross-over extender card 94 by setting mux control signal 74 to 0, then switching mux control signal 74 to 1 to test the ECC DRAM chip with the test patterns.

Mux switch 72 could switch the 8 data bits, and could also switch clocking and control signals specific to the 8 data bits such as data strobes and a data mask. The timing of these control signals can be different for the data DRAM chips and the ECC DRAM chips. For example, some systems may delay writing the ECC code to the ECC DRAM to allow time for computing the ECC code.

ALTERNATE EMBODIMENTS

Several other embodiments are contemplated by the inventors. For example, a different one of the data DRAM chips could be crossed-over with the ECC DRAM chip. For example, data DRAM chip D5 could be crossed over rather than chip D4, or some other data DRAM chip could be used. The sizes of the ECC DRAM chip and the data DRAM chips do not have to be the same, and some bits in the ECC DRAM chip may be unused. Two or more data DRAM chips could be crossed-over with one ECC DRAM chip, or only some of the data lines of a DRAM chip could be crossed over to the ECC DRAM chip.

The memory module may contain additional components, such as passive capacitors and resistors, and active components such as buffer chips, and registers for buffering control, address, or data lines.

The PC motherboard can be a standard motherboard, or can be a modified board, such as one having the socket for the extender card reverse-mounted on the solder side rather than the component side of the motherboard substrate. The PC motherboard can be one of several in a larger test system, such as in a robotic test system. A handler can automatically insert and remove the memory modules being tested, or a robotic arm or human operator can handle the memory modules under test.

More than one of the memory module slots on the PC motherboard may be loaded with an extender card, allowing two or more memory modules to be tested at the same time by the same PC motherboard. Each memory module socket or slot could have a different value of device-address lines so each slot could be accessed separately. Using two or more extender cards and slots increases testing throughput.

The cross-over extender card may be integrated with the memory module socket on the PC motherboard, or the cross-over connection may be added to the wiring or logic on the motherboard. A standard straight-through extender card or no extender card may then be used. The cross-over extender card could have other components or be a more complex adapter board with other functions.

Some signals or lines could be tied high or low on crossover extender card 44 or by the motherboard. Inverters could be mounted on cross-over extender card 44 to invert some signals or data. The data signals could include data strobes and data mask signals, or dual-use signals that sometimes carry data and other times carry other information, such as mask or programming information for the DRAMs.

An unused address line could be used for the mux control, or a pre-defined data pattern or address or sequence could be detected by logic on the cross-over extender card and used to control the mux. A mechanical control switch could also be used for controlling the cross-over.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. An extender card comprising:
   a substrate containing wiring traces for conducting signals;
   first contact pads along a first edge of the substrate, the first contact pads for mating with a memory module socket on a motherboard;
   a test socket, mounted to the substrate, for receiving a memory module during testing and programming;
   wherein the wiring traces on the substrate include lines carrying address, data, and controls signals from the motherboard that are passed through to the test socket at pads for connecting to memory chips on the memory module;
   wherein the memory chips on the memory module include a plurality of data memory chips for storing user data from the motherboard, and an error-correction code (ECC) memory chip for storing correction code generated by a code generator on the motherboard, the correction code being a pre-defined function of the user data;
   wherein the wiring traces on the substrate include a plurality of first data lines and a plurality of second data lines that carry the user data from the motherboard, and a plurality of ECC lines that carry the correction code from the motherboard;
   wherein the test socket includes first contacts and second contacts that connect to the memory chips on the memory module inserted into the test socket, and ECC contacts that connect to the ECC memory chip on the memory module inserted into the test socket;
   wherein the plurality of first data lines connect to the first contacts in the test socket to connect to memory chips on the memory module inserted into the test socket; and
   cross-over means, on the substrate, for connecting the second data lines to the ECC contacts in the test socket and for connecting the ECC lines to the second contacts of the test socket during an ECC test mode;
   wherein user data containing test patterns are written to the ECC memory chip through the cross-over means during the ECC test mode, while the correction code from the motherboard is written to one of the memory chips connected to the second contacts in the test socket.

2. The extender card of claim 1 wherein the cross-over means comprises:
   a first hardwired connection from the second data lines to the ECC contacts of the test socket; and
   a second hardwired connection from the ECC lines to the second contacts of the test socket,
   whereby ECC cross-over is hardwired into the extender card.

3. The extender card of claim 1 wherein the cross-over means comprises:
   a controllable switch, having a first port receiving the second data lines, a second port receiving the ECC lines,
   a third port connected to the second contacts, and a fourth port connected to the ECC contacts of the test socket;
   wherein the controllable switch connects the first port to the fourth port, and connects the second port to the third port, during the ECC test mode, to allow the user data that is a test pattern to be written to the ECC memory chip to test for pattern-sensitive errors in the ECC memory chip of the memory module;
   wherein the controllable switch connects the first port to the third port, and connects the second port to the fourth port, during a normal mode, to allow the user data that is a test pattern to be written to the memory chips and to allow the correction code to be written to the ECC memory chip of the memory module.

4. The extender card of claim 3 wherein the controllable switch further comprises:
   a mode input, the mode input indicating the ECC test mode or the normal mode.

5. The extender card of claim 4 wherein the mode input is connected to a mode pad of the first contact pads, the mode pad connecting to a mode signal generated by the motherboard, the mode signal being activated to indicate the ECC test mode during execution of a test program for testing the memory module inserted into the test socket.

6. The extender card of claim 5 wherein the mode pad connects to an upper address bit generated by the motherboard, the upper address bit having a significance greater than a size of memory in the plurality of data memory chips on the memory module inserted into the test socket.

7. The extender card of claim 1 wherein the second data lines comprise 8 data lines;
   wherein the ECC lines comprise 8 lines;
   whereby 8 data lines are crossed over during the ECC test mode.

8. The extender card of claim 1 wherein the memory chips on the memory module include a plurality N data memory chips, wherein N is a power of 2 or is double a power of 2;
   wherein the ECC memory chip is a single memory chip;
   wherein a total number of memory chips on the memory module is not a power of 2.

9. The extender card of claim 1 wherein the correction code contains information sufficient for an error corrector on the motherboard to locate and correct a single bit error in the user data.

10. A motherboard-based memory-module tester comprising:

a personal computer motherboard having a microprocessor for executing programs;

a memory controller on the personal computer motherboard for generating memory address and control signals for reading and writing user data to a memory module under test;

an error-correction code (ECC) generator on the personal computer motherboard, the ECC generator receiving user data and generating correction code;

a plurality of memory module sockets on the personal computer motherboard for receiving memory modules containing memory chips;

an extender card having lower contact pads for fitting into one of the plurality of memory module sockets;

wherein the lower contact pads includes ECC data contacts for connecting to the ECC generator to carry the correction code, and first data contacts for carrying a first portion of the user data;

a test socket on the extender card for receiving the memory module under test, the memory module under test having a plurality of memory chips and an ECC memory chip;

wherein the test socket includes ECC data lines for connecting to data inputs of the ECC memory chip, and first data lines for connecting to data inputs of a first memory chip in the plurality of memory chips;

memory-signal wiring traces on the extender card for passing memory address and control signals through from the lower contact pads to the test socket, the memory address and control signals being generated by the personal computer motherboard to access the memory chips and the ECC memory chip on the memory module under test;

memory-data wiring traces on the extender card for passing memory data signals through from the lower contact pads to the test socket, the memory data signals being generated by the personal computer motherboard or by other memory chips in the plurality of memory chips on the memory module under test but not by the first memory chip or by the ECC memory chip; and cross-over wiring traces that connect the ECC data contacts to the first data lines in the test socket, and that connect the first data contacts to the ECC data lines in the test socket, wherein the first portion of the user data is stored in the ECC memory chip;

wherein the correction code from the ECC generator on the personal computer motherboard is stored in the first memory chip in the plurality of memory chips.

11. The motherboard-based memory-module tester of claim 10 further comprising:

a mux switch, mounted on the extender card, intercepting the cross-over wiring traces, the mux switch having a control input;

wherein the mux switch connects the ECC data contacts to the first data lines in the test socket, and connects the first data contacts to the ECC data lines in the test socket, when the control input indicates an ECC test mode;

wherein the mux switch connects the first data contacts to the first data lines in the test socket, and connects the ECC data contacts to the ECC data lines in the test socket, when the control input does not indicate the ECC test mode.

12. The motherboard-based memory-module tester of claim 10 wherein the memory chips and the ECC memory chip are dynamic-random-access memory (DRAM).

13. The motherboard-based memory-module tester of claim 10 wherein the correction code generated by the ECC generator and stored in the memory module under test contains information sufficient for an error corrector on the personal computer motherboard to locate and correct a single bit error in the user data.

14. The motherboard-based memory-module tester of claim 10 wherein the memory chips on the memory module include a plurality N data memory chips, wherein N is a power of 2 or is double a power of 2;

wherein the ECC memory chip is a single memory chip;

wherein a total number of memory chips on the memory module is not a power of 2.

15. The motherboard-based memory-module tester of claim 10 wherein the memory module under test is a registered memory module with a register and a phase-locked loop (PLL) buffer to generate clocks to the ECC memory chip and to each of the memory chips.

16. A method for testing a memory module using a personal computer (PC) motherboard comprising:

inserting a memory module under test into a test socket, the memory module under test having memory chips and an error-correction code (ECC) memory chip;

during a first test phase, testing the memory chips using a memory controller on the PC motherboard, by writing test pattern data to the memory chips on the memory module under test, and reading test pattern data from the memory chips on the memory module under test inserted into the test socket to test the memory chips with the test pattern data;

generating correction code for each word of the test pattern data written to the memory chips;

writing the correction code to the ECC memory chip for each word of the test pattern data;

reading the correction code from the ECC memory chip for each word of the test pattern data and comparing the correction code to a re-generated correction code generated from the test pattern data read from the memory chips to signal an error when a mis-match occurs;

during a second test phase, crossing over data signals so that data signals to one of the memory chips is sent to the ECC memory chip wherein a portion of the test pattern data is written to the ECC memory chip; and testing the ECC memory chip using the memory controller on the PC motherboard, by writing a portion of the test pattern data to the ECC memory chip on the memory module under test, and reading a portion of test pattern data from the ECC memory chip on the memory module under test inserted into the test socket to test the ECC memory chip with a portion of the test pattern data.

17. The method of claim 16 wherein the second test phase further comprises generating correction code for each word of the test pattern data written to the memory chips;

writing the correction code to a swapped portion of the memory chips for each word of the test pattern data;

reading the correction code from the swapped portion of the memory chips for each word of the test pattern data and comparing the correction code to a re-generated correction code generated from the test pattern data read from the memory chips and from the ECC memory chip to signal an error when a mis-match occurs.

18. The method of claim 16 wherein crossing over data signals comprises activating a mux control signal that causes a switch to connect data signals containing the portion of the test pattern data to the ECC memory chip.

19. The method of claim 18 wherein the switch is on a cross-over extender card between the PC motherboard and the memory module under test, or is integrated with a test socket on the PC motherboard.

20. The method of claim 16 wherein writing to the memory chips on the memory module comprises writing to substantially all memory locations on the memory chips to test all memory locations for failures.

* * * * *